US007657767B2

(12) United States Patent
Rusu et al.

(10) Patent No.: US 7,657,767 B2
(45) Date of Patent: Feb. 2, 2010

(54) CACHE LEAKAGE SHUT-OFF MECHANISM

(75) Inventors: Stefan Rusu, Sunnyvale, CA (US);
Tsung-Yung Chang, Cupertino, CA (US); Kevin Zhang, Portland, CA (US); Fatih Hamzaoglu, Hillsboro, OR (US); Jonathan Shoemaker, Sunnyvale, CA (US); Ming Huang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 582 days.

(21) Appl. No.: 11/174,204

(22) Filed: Jun. 30, 2005

(65) Prior Publication Data

US 2007/0005999 A1 Jan. 4, 2007

(51) Int. Cl.
*G06F 1/00* (2006.01)
*G06F 1/32* (2006.01)
(52) U.S. Cl. .................. 713/323; 713/300; 713/320; 713/330; 326/33; 326/34; 326/83
(58) Field of Classification Search ................ 713/323, 713/300, 320, 330; 365/1–244; 326/33, 326/34, 83
See application file for complete search history.

(56) References Cited

U.S. PATENT DOCUMENTS

| 2,753,527 | A  | * | 7/1956  | Adler .......................... 333/141 |
| 5,781,916 | A  | * | 7/1998  | Hardage et al. ............. 711/118 |
| 6,977,519 | B2 | * | 12/2005 | Bhavnagarwala et al. ..... 326/34 |
| 2006/0119393 | A1 | * | 6/2006 | Hua et al. .................... 326/121 |
| 2006/0206739 | A1 | * | 9/2006 | Kim et al. .................... 713/322 |

* cited by examiner

*Primary Examiner*—Thomas Lee
*Assistant Examiner*—Michael J Brown
(74) *Attorney, Agent, or Firm*—Blakely, Sokoloff, Taylor & Zafman LLP

(57) ABSTRACT

In one embodiment of the present invention, a technique is provided to control leakage of a cache sub-array. Other embodiments are disclosed herein. A sleep and shut-off circuit is connected between a virtual supply terminal and a first physical supply terminal to reduce leakage from the cache sub-array when the cache sub-array is disabled in a shut-off mode. The cache sub-array is connected between the virtual supply terminal and a second physical supply terminal. An active circuit is connected to the sleep and shut-off circuit in parallel to enable the cache sub-array in a normal mode and to disable the cache sub-array in the shut-off mode.

23 Claims, 10 Drawing Sheets

CACHE LEAKAGE SHUT-OFF MECHANISM

BACKGROUND

1. Field of the Invention

Embodiments of the invention relate to the field of microprocessors, and more specifically, to cache leakage.

2. Description of Related Art

Modern microprocessors include a large amount of caches on-chip or off-chip. Many of these cache devices have a portion of the cache disabled, or fused off, for smaller cache sizes to provide better yields during the manufacturing process. These fused-off parts also allow for market differentiation for their lower costs.

For these fused-off parts, cache leakage power accounts for an increasingly larger amount of the total power consumption. The leakage power may be at around one Watt per Megabyte. For very large caches in modern microprocessor systems, the total leakage power is prohibitively expensive.

BRIEF DESCRIPTION OF THE DRAWINGS

Embodiments of the invention may best be understood by referring to the following description and accompanying drawings that are used to illustrate embodiments of the invention. In the drawings.

DESCRIPTION

In one embodiment of the present invention, a technique is provided to control leakage of a cache sub-array. Other embodiments are disclosed herein. A sleep and shut-off circuit is connected between a virtual supply terminal and a first physical supply terminal to reduce leakage from the cache sub-array when the cache sub-array is disabled in a shut-off mode. The cache sub-array is connected between the virtual supply terminal and a second physical supply terminal. An active circuit is connected to the sleep and shut-off circuit in parallel to enable the cache sub-array in a normal mode and to disable the cache sub-array in the shut-off mode.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

Figure 1:
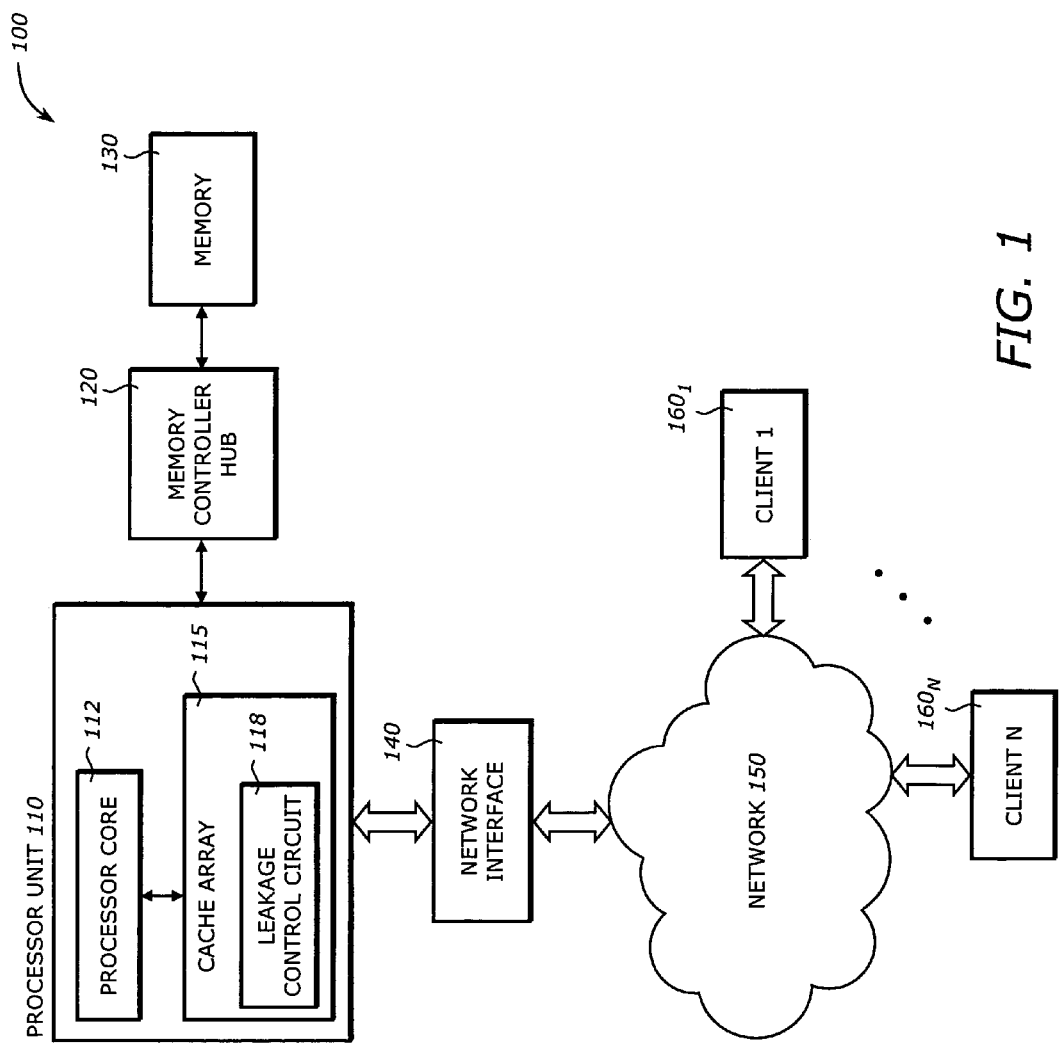
FIG. 1 is a diagram illustrating a processing system in which one embodiment of the invention can be practiced.

FIG. 1 is a diagram illustrating a processing system 100 in which one embodiment of the invention can be practiced. The system 100 includes a processor unit 110, a memory controller hub (MCH) 120, a main memory 130, a network interface 140, a network 150, and clients $160_1$ to $160_N$.

The processor unit 110 represents a central processing unit of any type of architecture, such as processors using hyper threading, security, network, digital media technologies, single-core processors, multi-core processors, embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture. The processor unit 110 includes at least a processor core 112 and a cache array 115. The processor core 110 includes basic elements of a programmable processor such as an instruction and data fetch unit, an instruction decoder, etc. The cache array 115 includes an array of cache memory for frequent accesses. The cache array 115 may contain instructions or data or both. The cache array 115 may have parts that have been disabled, or fused off, portions or sub-arrays. These parts are provided together with non-fused off parts during the manufacturing process to improve the manufacturing yield. The cache array 115 includes a leakage control circuit 118. The leakage control circuit 118 controls leakage power from the disabled portions of the cache array 115 and other portions. It essentially reduces leakage power by permanently shutting off these disabled portions. The cache array 115 may also be located externally to the processor unit 110 as an external cache.

The MCH 120 provides control and configuration of memory and input/output devices such as the main memory 130 and the network interface 140. The MCH 120 may be integrated into a chipset that integrates multiple functionalities such as graphics, media, isolated execution mode, host-to-peripheral bus interface, memory control, power management, etc. The MCH 120 or the memory controller functionality in the MCH 120 may be integrated in the processor unit 110. In some embodiments, the memory controller, either internal or external to the processor unit 110, may work for all cores or processors in the processor unit 110. In other embodiments, it may include different portions that may work separately for different cores or processors in the processor unit 110.

The main memory 130 stores system code and data. The main memory 130 is typically implemented with dynamic random access memory (DRAM), static random access memory (SRAM), or any other types of memories including those that do not need to be refreshed.

The network interface 140 provides interface to the network 150. The network interface 140 is typically a network interface card (NIC) installed as an adapter to provide a connection point to the network 150. The NIC may also provide an attachment for a specific type of cable, such as coaxial cable, twisted-pair cable, or fiber-optic cable. It may also have antenna for communication with a base station in a wireless connectivity. The network 150 may be any type of network such as Local Area Network (LAN), Wide Area Network (WAN), intranet, extranet, the Internet, Ethernet, token ring, Fiber Distributed Data Interface (FDDI), wireless LAN, etc. The clients $160_1$ to $160_N$ are any clients that connect to the network 150 for communication, data exchanges, message transmission, etc. Any of the clients $160_1$ to $160_N$ may run any application such as database, transactional processing, graphics, games, media processing, etc.

Although not shown, the system 100 typically includes an interconnect for the processor unit 110 to provide interface to peripheral devices. The interconnect may be point-to-point or connected to multiple devices. It is contemplated that the interconnect may include any interconnect or bus such as Peripheral Component Interconnect (PCI), PCI Express, Universal Serial Bus (USB), and Direct Media Interface (DMI), etc.

The system 100 also typically includes a mass storage device to store archive information such as code, programs, files, data, and applications and input/output (I/O) devices. In a typical server, the mass storage device may include high performance redundant array of inexpensive disks (RAIDs) to store a large amount of information and data such as databases, transactional databases, applications, etc. The mass storage device may include compact disk (CD) read-only memory (ROM), digital video/versatile disc (DVD), floppy drive, hard drive, and any other magnetic or optic storage devices. The mass storage device provides a mechanism to read machine-accessible media. The I/O devices may include any I/O devices to perform I/O functions. Examples of the I/O devices include controller for input devices (e.g., keyboard, mouse, trackball, pointing device), media card (e.g., audio, video, graphics), network card, and any other peripheral controllers.

Figure 2:
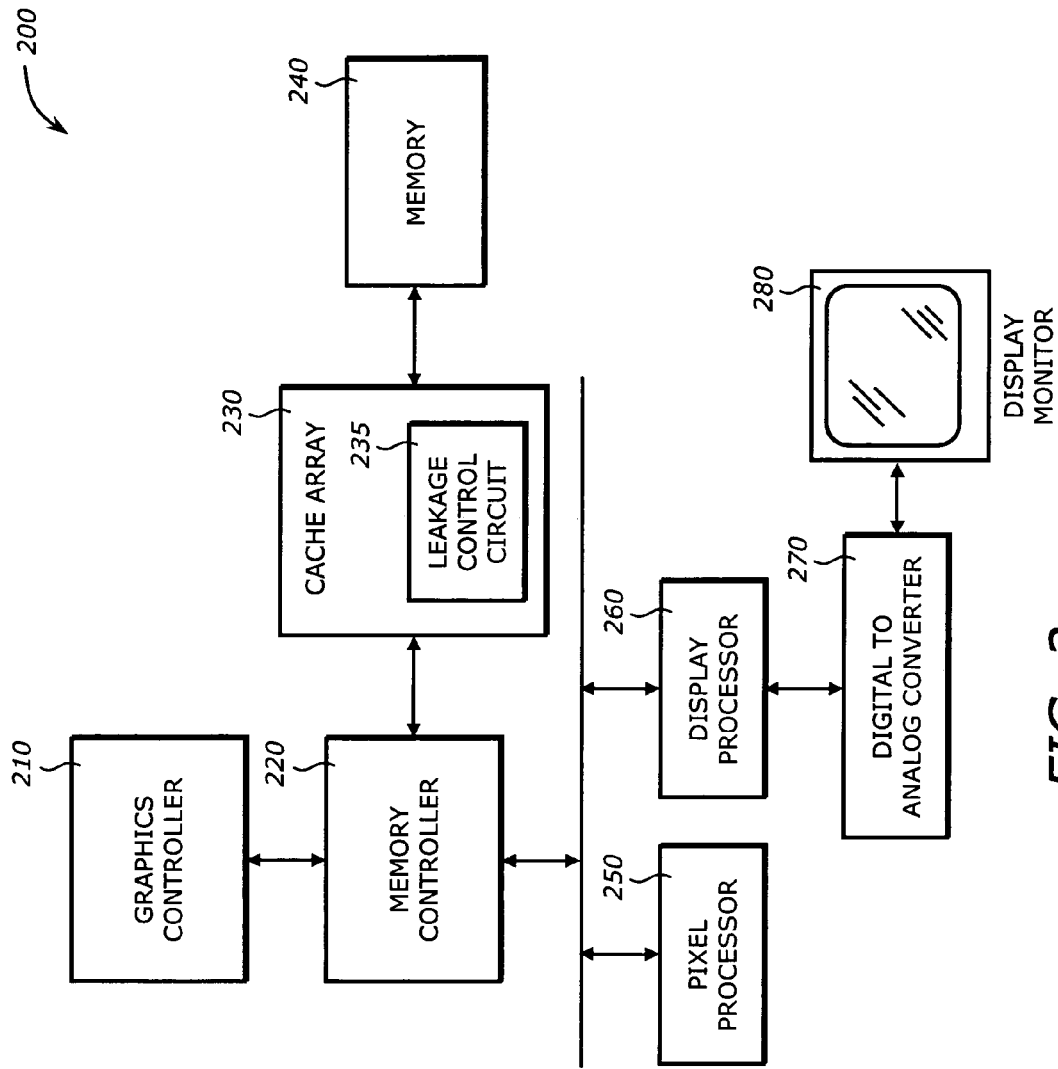
FIG. 2 is a diagram illustrating a graphics system in which one embodiment of the invention can be practiced.

FIG. 2 is a diagram illustrating a graphics system 200 in which one embodiment of the invention can be practiced. The graphics system 200 includes a graphics controller 210, a memory controller 220, a cache array 230, a memory 240, a pixel processor 250, a display processor 260, a digital-to-analog converter (DAC) 270, and a display monitor 280.

The graphics controller 210 is any processor that has graphic capabilities to perform graphics operations such as fast line drawing, two-dimensional (2-D) and three-dimensional (3-D) graphic rendering functions, shading, anti-aliasing, polygon rendering, transparency effect, color space conversion, alpha-blending, chroma-keying, etc. The memory controller 220 performs memory control functions and interface to the pixel processor 250 and the display processor 260.

The cache array 230 is similar to the cache array 115 in FIG. 1. It includes an array of cache memory for frequent accesses. The cache array 230 may contain instructions or data or both. The cache array 230 may have parts that have been disabled, or fused off, portions or sub-arrays. These parts are provided together with non-fused off parts during the manufacturing process to improve the manufacturing yield. The cache array 230 includes a leakage control circuit 235. The leakage control circuit 235 controls leakage power from the disabled portions of the cache array 230 and other portions. It essentially reduces leakage power by permanently shutting off these disabled portions. The memory 240 includes memory devices to store graphic data or instructions processed by the graphic controller 210. It may also be accessible to the pixel processor 250 and display processor 260.

The pixel processor 250 is a specialized graphic engine that can perform specific and complex graphic functions such as geometry calculations, affine conversions, model view projections, 3-D clipping, etc. The pixel processor 250 is also interfaced to the memory controller 220 to access the cache array 230 or the memory 240 and/or the graphic controller 210. The display processor 260 processes displaying the graphic data and performs display-related functions such as palette table look-up, synchronization, backlight controller, video processing, etc. The DAC 270 converts digital display digital data to analog video signal to the display monitor 280. The display monitor 280 is any display monitor that displays the graphic information on the screen for viewing. The display monitor may be a Cathode Ray Tube (CRT) monitor, a television (TV) set, a Liquid Crystal Display (LCD), a Flat Panel, or a Digital CRT.

Figure 3:
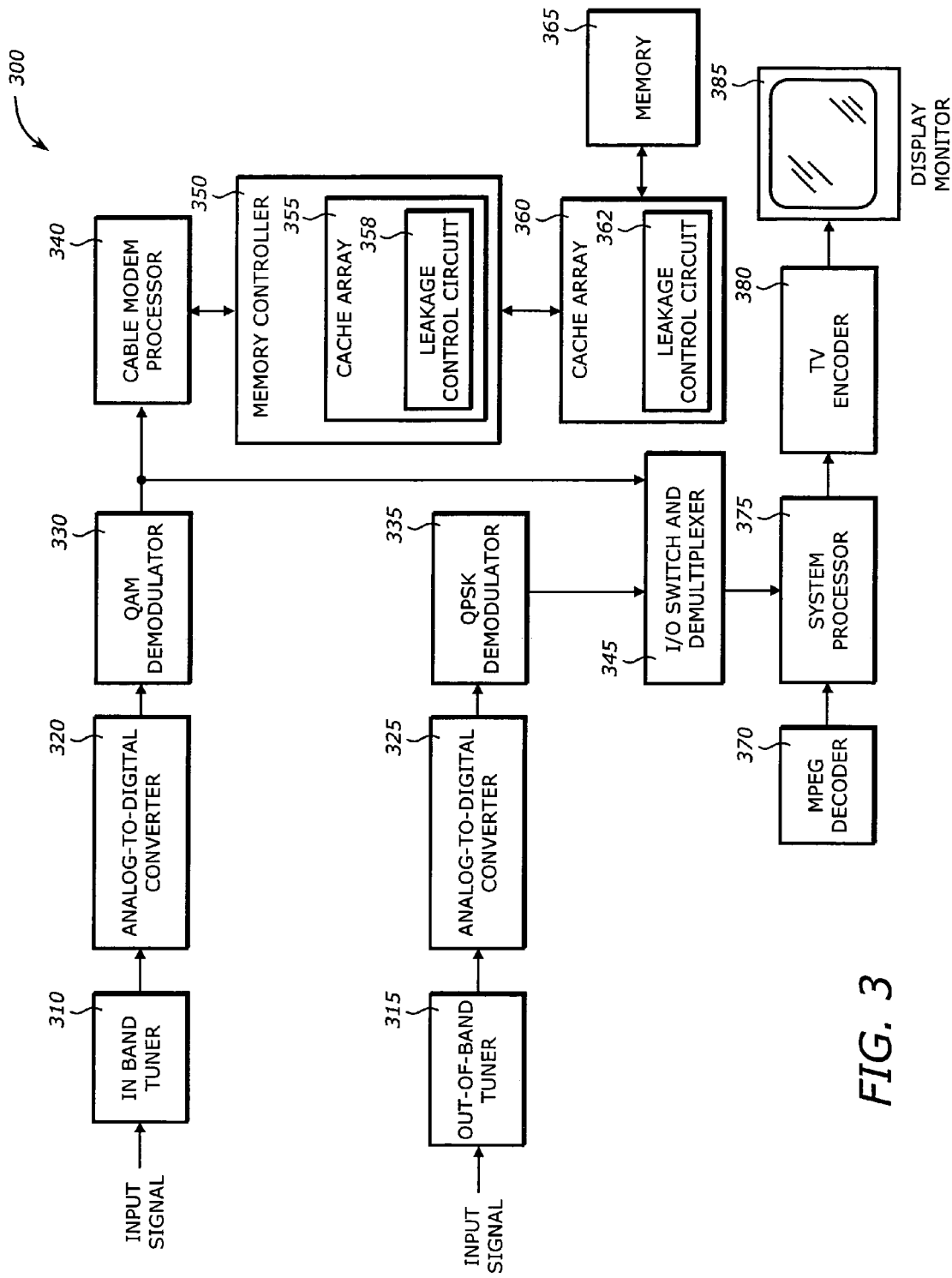
FIG. 3 is a diagram illustrating a set-top box in which one embodiment of the invention can be practiced.

FIG. 3 is a diagram illustrating a set-top box 300 in which one embodiment of the invention can be practiced. The set-top box 300 includes an in-band (IB) tuner 310, an out-of-band (OOB) tuner 315, analog-to-digital converters (ADCs) 320 and 325, a quadrature amplitude modulation (QAM) demodulator 330, a quadrature or quaternary phase shift keying (QPSK) demodulator 335, a cable modem processor 340, a memory controller 350, a cache array 360, a memory 365, an I/O switch and demultiplexer 345, a Moving Picture Expert Group (MPEG) decoder 370, a system processor 375, a television (TV) encoder 380, and a display monitor 385.

The in-band tuner 310 receives a 36-44 MHz carrier frequency signal. The ADC 320 converts the analog signal to digital data. The QAM demodulator 330 includes a mixer and multi-rate filters to convert the over-sampled intermediate frequency (IF) data stream to a base-band complex data stream. The cable modem processor 340 processes the base-band complex signal and supports Data Over Cable Service Interface Specification (DOCSIS) and other cable modem standards. The OOB tuner 315 receives signal in the 70-100 MHz frequency range. The ADC 325 converts OOB received signal to digital data. The QPSK demodulator 335 demodulates the digital data stream to a base-band signal. The I/O switch and de-multiplexer 345 provides transport of data stream to the system processor 375. The system processor 375 processes the data stream and performs other system functions such as navigation/user interface, advanced electronic program guides and other interactive TV applications. The TV encoder 380 encodes the data stream into video signal to be displayed on the display monitor 385. The memory controller 350 provides interface to the memory 365. The memory controller 350 includes an internal cache array 355. The internal cache array 355 includes a leakage control circuit 358. The external cache array 360 is typically similar to the cache array 355 except that it may contain a larger amount of cache memories. The cache array 360 includes a leakage control circuit 362. The memory 365 contains instruction and/or data for the cable modem processor 340. The internal and external cache arrays 355 and 360 are similar to the cache arrays 115 and 230 in FIGS. 1 and 2, respectively. The MPEG decoder 370 decodes the video data stream in MPEG format.

Embodiments of the invention may be used in a processor, a memory controller or as a stand-alone circuit or subsystem. The use of the memory controller or the processor described herein is for illustrative purposes only. Other circuits using memories including cache memories may use the leakage control circuit.

Figure 4:
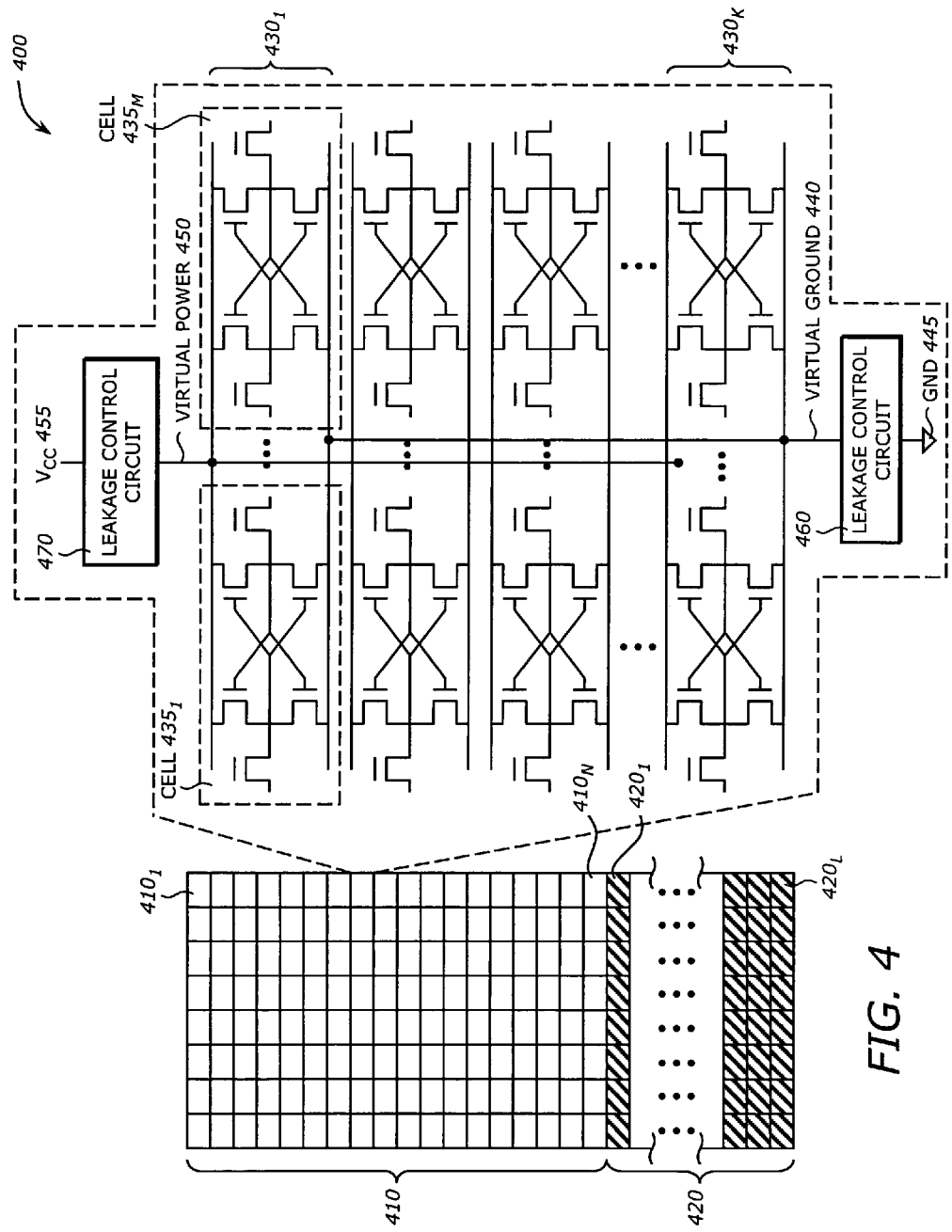
FIG. 4 is a diagram illustrating a cache array with leakage control circuit according to one embodiment of the invention.

FIG. 4 is a diagram illustrating a cache array 400 with leakage control circuit according to one embodiment of the invention. The cache array 400 represents the cache arrays 115, 230, 355, and 360 shown in FIGS. 1, 2, and 3, respectively. It includes a section 410 and a redundant section 420.

The section 410 includes the cache sub-arrays organized row-wise or column-wise. For example, it may include rows $410_1$ to $410_N$. The redundant section 420 includes similar cache sub-arrays but is used for replacing faulty sub-arrays in the section 410. It includes rows $420_1$ to $420_L$. The routing and replacement of the redundant sub-arrays is performed by a control logic circuit (not shown).

Each of the cache sub-arrays has leakage control circuits. A sub-array 425 is shown to illustrate the components of these cache sub-arrays. The sub-array 425 includes K rows $430_1$ to $430_K$ of memory cells. Each row contains a number of memory cells. For example, row $430_1$ contains M memory cells $435_1$ to $435_M$. The supply terminals of the rows are connected together to form virtual supply terminals. The virtual supply terminals may be a virtual ground terminal or a virtual power terminal. The memory cell ground terminals are connected together to a sub-array virtual ground terminal 440. The memory cell power terminals are connected together to a sub-array virtual power terminal 450.

The leakage control circuit may be located in at least one of two places. The first place is between the virtual ground terminal 440 and the physical ground terminal 445 where a leakage control circuit 460 is located. The second place is between the virtual power terminal 450 and the physical power terminal 455 where a leakage control circuit 470 is located. Normally, the leakage control circuit is located in only one of the two locations. When the leakage control circuit is used at one location, the virtual supply terminal at the other location is connected directly to the physical supply terminal.

Figure 5A:
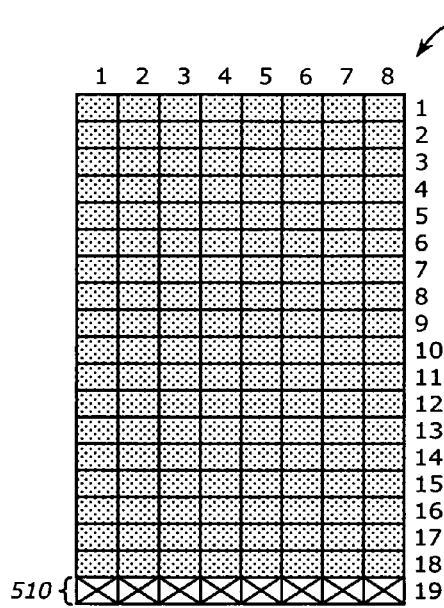
FIG. 5A is a diagram illustrating a cache array with redundant sub-arrays according to one embodiment of the invention.

FIG. 5A is a diagram illustrating a cache array 500A with redundant sub-arrays according to one embodiment of the invention. For illustrative purposes only, the cache array 500A includes 18 rows of normal cache sub-arrays and a row 510 of redundant cache sub-arrays. Any of the redundant sub-arrays in row 510 can be used to replace a faulty sub-array in the other rows. In this example, none of the redundant sub-arrays in row 510 is used to replace any faulty or defective sub-array.

Figure 5B:
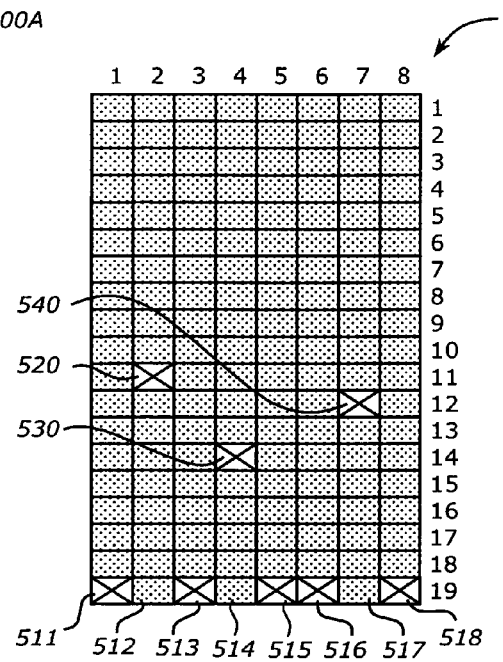
FIG. 5B is a diagram illustrating a cache array having redundant sub-arrays replacing bad sub-arrays according to one embodiment of the invention.

FIG. 5B is a diagram illustrating a cache array 500B having redundant sub-arrays replacing faulty or defective sub-arrays according to one embodiment of the invention. In this example, the cache sub-arrays 520, 530, and 540 are found to be faulty. The redundant sub-arrays 512, 514, and 517 are then used to replace the faulty or defective sub-arrays 520, 530, and 540, respectively.

If a redundant sub-array is not used to replace a faulty or defective sub-array, it is placed in the shut-off mode to reduce leakage power. If a redundant sub-array is used to replace a faulty or defective sub-array, then that faulty or defective sub-array is placed in the shut-of mode to reduce leakage power. In the example shown in FIG. 5B, the redundant sub-arrays 511, 513, 515, 516, and 518 are not used to replace any defective sub-array. Therefore, they are put in the shut-off mode. Similarly, the defective sub-arrays 520, 530, and 540 are replaced by the redundant sub-arrays 512, 514, 517, respectively. Therefore, the sub-arrays 520, 530, and 540 are put in the shut-off mode. Those sub-arrays that are placed in the shut-off mode are shown with a cross.

Figure 6A:
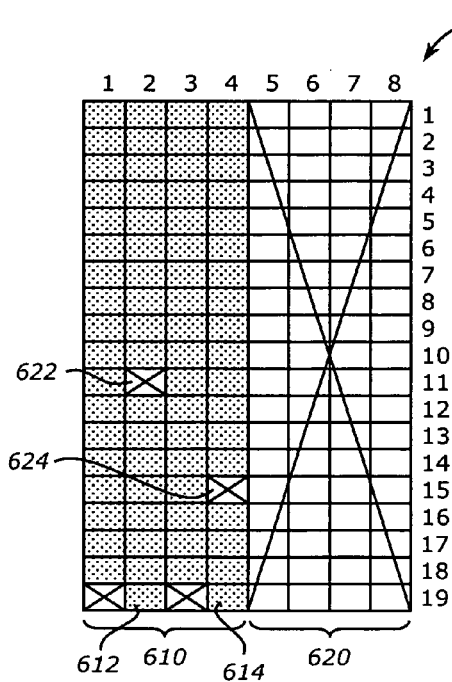
FIG. 6A is a diagram illustrating a cache array with contiguous shut-off sub-arrays according to one embodiment of the invention.

FIG. 6A is a diagram illustrating a cache array 600A with contiguous shut-off sub-arrays according to one embodiment of the invention. The cache array 600A includes sections 610 and 620. Each of the sections 610 and 620 includes contiguous sub-arrays. These sub-arrays may be contiguous column-wise or row-wise. In the example shown in FIG. 6A, the sub-arrays are contiguous column-wise.

The section 610 includes sub-arrays that are enabled for normal operation and redundant sub-arrays. For example, redundant sub-arrays 612 and 614 replace faulty sub-arrays 622 and 624 respectively. The section 620 includes sub-arrays that are disabled, shut-off, or fused-off.

Figure 6B:
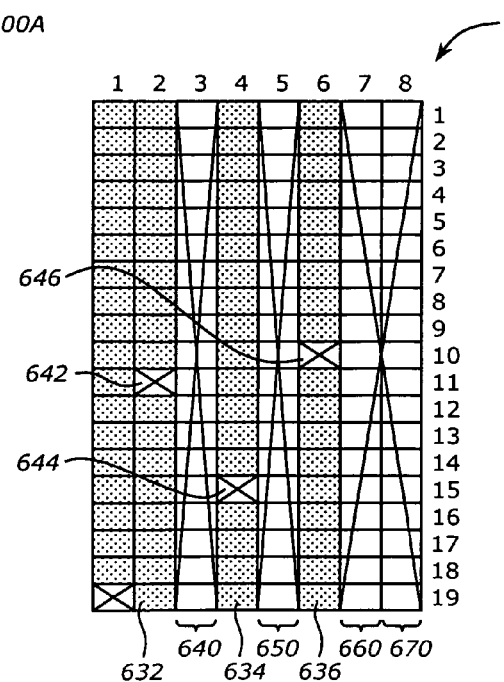
FIG. 6B is a diagram illustrating a cache array with distributed shut-off arrays according to one embodiment of the invention.

FIG. 6B is a diagram illustrating a cache array 600B with distributed shut-off arrays according to one embodiment of the invention. The cache array 600B includes the columns 640, 650, 660, and 670. These columns contain disabled, or shut-off sub-arrays and are not contiguous. They are distributed within the array 600B according to their fault or failure severity. By designating a column to be shut-off according to its fault severity instead of its physical location as in FIG. 6A, the scheme in FIG. 6B provides the highest flexibility. Redundant sub-arrays may be used to replace faulty sub-arrays. For example, redundant sub-arrays 632, 634, and 636 replace faulty sub-arrays 642, 644, and 646, respectively.

In one embodiment, a sub-array in the cache array 500A, 500B, 600A, or 600B may be in one of three modes: a normal mode, a standby mode, and a shut-off mode. The normal mode is the mode in which the sub-array operates normally as a memory element, e.g., it is accessible through read/write cycles. The standby or sleep mode is the mode in which the sub-array is idle and may retain valid data with reduced power consumption. The shut-off mode is the mode in which the sub-array is disabled or become non-functional. The leakage control circuit 460 or 470 provides a control mechanism to allow the associated sub-array to operate in any one of these three modes.

Figure 7A:
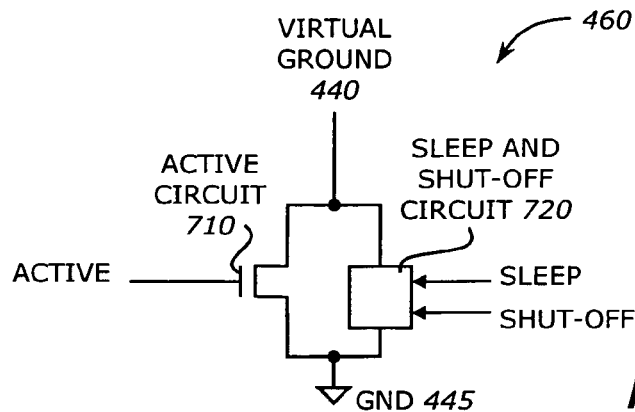
FIG. 7A is a diagram illustrating a leakage control circuit with virtual ground according to one embodiment of the invention.

FIG. 7A is a diagram illustrating a leakage control circuit 460 with virtual ground according to one embodiment of the invention. As shown in FIG. 4, the circuit 460 is connected between the virtual ground terminal 440 and the physical ground terminal 445. The circuit 460 includes an active circuit 710 and a sleep/shut-off circuit 720.

The active circuit 710 is connected in parallel to the sleep/shut-off circuit 720 between the virtual ground terminal 440 and the physical ground terminal 445. The active circuit 710 enables the associated cache sub-array in the normal mode and to disable the associated cache sub-array in the shut-off mode. As shown in FIG. 4, the associated cache sub-array is connected between the virtual ground terminal 440 and the physical power terminals 445. Note that in this configuration, the leakage control circuit 470 in FIG. 4 does not exist. The sleep/shut-off circuit 720 is connected between the virtual ground terminal and the physical ground terminal 445 to reduce leakage from the associated cache sub-array 440 when the cache sub-array is disabled. It is controlled by the sleep control signal and the shut-off control signal.

In one embodiment, the active circuit 710 includes an active transistor of n-type or N-channel metal oxide semiconductor (NMOS) controlled by an active control signal. The active transistor is turned on in the normal mode and turned off in the shut-off mode. When the active control signal is asserted HIGH, the transistor 710 is turned on, effectively short-circuiting the sleep/shut-off circuit 720. When the active control signal is negated LOW, the transistor 710 is turned off, leaving the sleep/shut-off circuit 720 to operate according to its function as determined by the sleep and shut-off control signals.

Figure 7B:
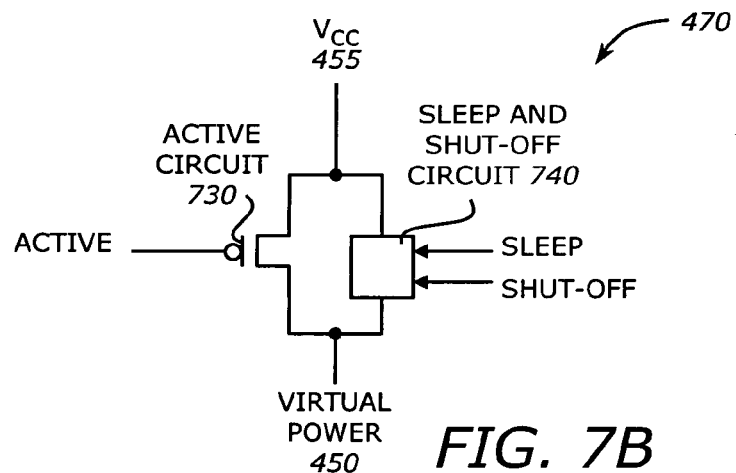
FIG. 7B is a diagram illustrating a leakage control circuit with virtual power according to one embodiment of the invention.

FIG. 7B is a diagram illustrating a leakage control circuit 470 with virtual power according to one embodiment of the invention. The circuit 470 is connected between the virtual power terminal 450 and the physical power terminal 455. The circuit 470 includes an active circuit 730 and a sleep/shut-off circuit 740.

The active circuit 730 is connected in parallel to the sleep/shut-off circuit 740 between the virtual power terminal 450 and the physical power terminal 455. The active circuit 730 enables the associated cache sub-array in a normal mode and to disable the associated cache sub-array in a shut-off mode. As shown in FIG. 4, the associated cache sub-array is connected between the virtual power terminal 450 and the physical ground terminal 445. Note that in this configuration, the leakage control circuit 460 in FIG. 4 does not exist. The sleep/shut-off circuit 740 is connected between the virtual power terminal 450 and the physical power terminal 455 to reduce leakage from the associated cache sub-array when the cache sub-array is disabled. It is controlled by the sleep control signal and the shut-off control signal.

In one embodiment, the active circuit 730 includes an active transistor of p-type or P-channel metal oxide semiconductor (PMOS) controlled by an active control signal. The active transistor 730 is turned on in the normal mode and turned off in the shut-off mode. When the active control signal is asserted LOW, the transistor 730 is turned on, effectively short-circuiting the sleep/shut-off circuit 740. When the active control signal is negated HIGH, the transistor 730 is turned off, leaving the sleep/shut-off circuit 740 to operate according to its function as determined by the sleep and shut-off control signals.

Figure 7C:
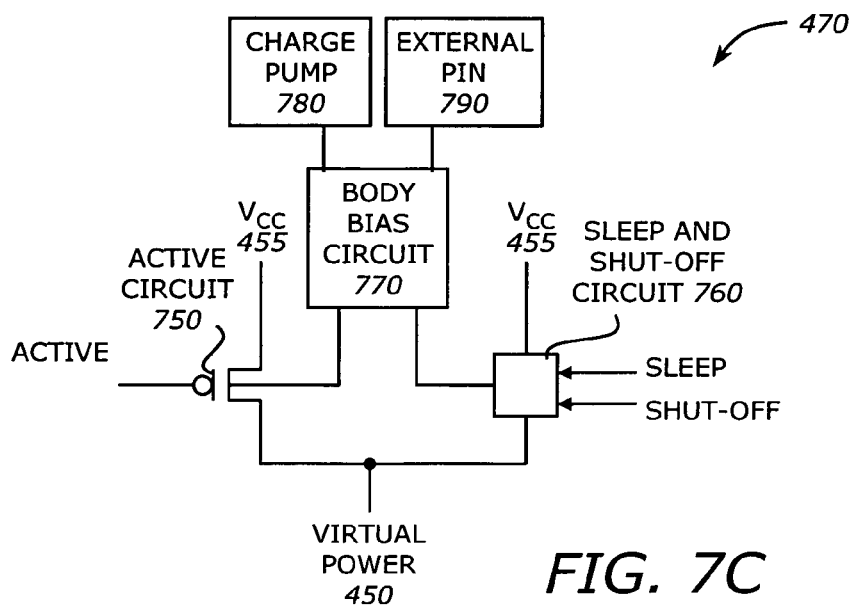
FIG. 7C is a diagram illustrating a leakage control circuit with virtual ground and body bias circuit according to one embodiment of the invention.

FIG. 7C is a diagram illustrating a leakage control circuit 470 with virtual power and body bias circuit according to one embodiment of the invention. The circuit 470 includes an active circuit 750, a sleep/shut-off circuit 760, and a body bias circuit 770.

The active circuit 750 and the sleep/shut-off circuit 760 are similar to the active circuit 730 and the sleep/shut-off circuit 740 in FIG. 7B except that they have a body bias voltage applied by the body bias circuit 770 to change the threshold voltage of the transistors. The body bias technique works best with PMOS devices in the sleep circuit of the sleep/shut-off circuit 760 because the body bias is local to the N-well housing the sleep transistor. It is expensive to implement separate body bias for the NMOS devices because it would require triple-well technology.

The body bias circuit 770 provides a body bias voltage to change the threshold voltage in the sleep and shut-off circuit and the active circuit. In one embodiment, the body bias circuit 770 includes an analog multiplexer to select the body bias voltage and the normal voltage. The body bias voltage may come from a number of sources. One source is a charge pump 780. Another source is an external voltage source 790 that can be applied to an external pin of the processor or the device.

During normal operation, the active control signal is asserted LOW to turn on the active circuit 750. The active circuit 750 may be implemented by a PMOS transistor. The body bias circuit 770 is switched to select the normal voltage. This normal voltage is essentially equivalent to no body bias. During shut-off mode, the active control signal is negated HIGH to turn off the active circuit 750, leaving the sleep/shut-off circuit 760 to operate under control of the sleep and shut-off control signals. The body bias circuit 770 is switched to select the body bias voltage from either the charge pump 780 or the external voltage source 790. The body bias may be a reverse body bias or a forward body bias. The reverse body bias is applied to increase the threshold voltage of the transistor(s) in the sleep/shut-off circuit 760 when the transistor(s) is/are turned off, and thus decreasing the sub-threshold leakage current. This results in further reduction of leakage power during sleep or shut-off mode.

The sleep/shut-off circuit 720 shown in FIG. 7A may be implemented in series (720A) or in parallel (720B). The series version separates the sleep circuit and the shut-off circuit while the parallel version merges the two circuits together in parallel to save area. Similarly, the sleep/shut-off circuit 740/760 may be implemented in series (740A/760A) or in parallel (740B/760B).

Figure 8A:
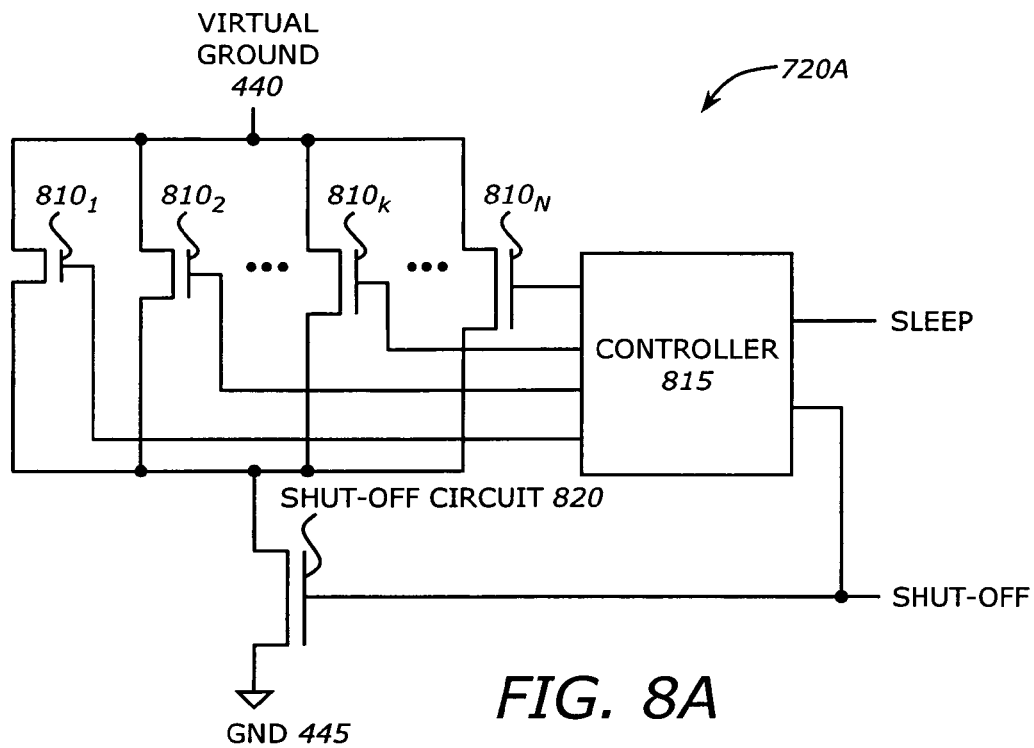
FIG. 8A is a diagram illustrating a sleep and shut-off circuit in series using n-devices according to one embodiment of the invention.

FIG. 8A is a diagram illustrating a sleep and shut-off circuit 720A in series using n-devices according to one embodiment of the invention. The sleep/shut-off circuit 720A includes sleep transistors $810_1$ to $810_N$, a controller 815, and a shut-off circuit 820. In essence, the sleep transistors $810_1$ to $810_N$ and the controller 815 form a sleep circuit.

The sleep transistors $810_1$ to $810_N$ are NMOS devices connected in parallel. These transistors are sized with different sizing factors to provide variable reduction of power consumption during sleep mode. The sizing factors may be determined so that the transistors form a binary weighed sizing in an N-bit word. For example, if N1 4, there are 16 levels of variation. The sleep transistor $810_1$ through $810_4$ may be sized to correspond to the binary weights of 1, 2, 4, and 8, respectively. The controller 815 provides the N control signals to turn on or turn off the sleep transistors $810_1$ to $810_N$ according to the desired reduction of power consumption. When the sleep control signal is asserted during the sleep mode, the controller 815 generates appropriate control signals to selectively turn on or turn off the sleep transistors $810_1$ to $810_N$ to achieve the desired level. When the shut-off control signal is asserted in the shut-off mode, the controller 815 generates control signals to turn off all the sleep transistors $810_1$ to $810_N$. The controller 815 may include a decoder logic circuit that is designed to provide the desired control signals.

The shut-off circuit 820 is connected to the transistors $810_1$ to $810_N$ in series to the physical power terminal 445. It includes a shut-off transistor controlled by a shut-off control signal. The shut-off transistor is of the same type as the transistors $810_1$ to $810_N$, i.e., it is an NMOS device. During the shut-off mode, the shut-off control signal is asserted LOW to turn off the shut-off transistor 820. The shut-off transistor 820 thus provides a lower leakage during the shut-off mode.

Figure 8B:
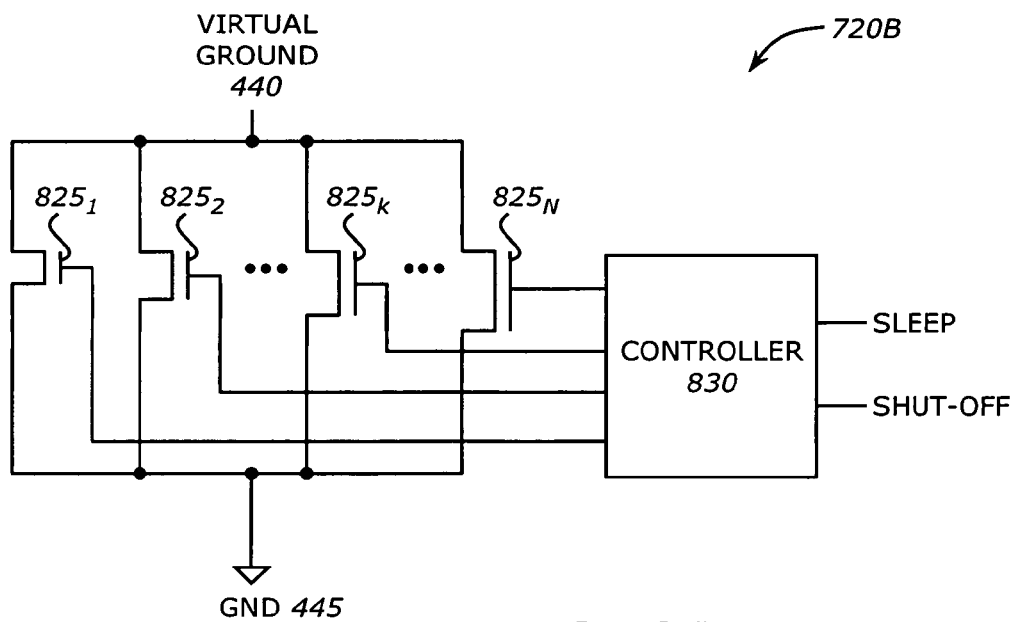
FIG. 8B is a diagram illustrating a sleep and shut-off circuit in parallel using n-devices according to one embodiment of the invention.

FIG. 8B is a diagram illustrating a sleep and shut-off circuit 720B in parallel using n-devices according to one embodiment of the invention. The sleep/shut-off circuit 720B includes sleep transistors $825_1$ to $825_N$ and a controller 830.

The sleep transistors $825_1$ to $825_N$ are similar to the sleep transistors $810_1$ to $810_N$ shown in FIG. 8A. They are proportionally sized according to a binary weighing scheme. The controller 830 generates appropriate control signals to selectively turn off the sleep transistors $825_1$ to $825_N$ according to the desired reduction of power consumption during the standby or sleep mode. In the shut-off mode, the controller 830 generates control signals to turn off all the sleep transistors $825_1$ to $825_N$, effectively shutting off all paths from virtual ground terminal 440 to the physical ground terminal 445. The sleep transistors $825_1$ to $825_N$ may be considered as including N−1 sleep transistors $825_1$ to $825_{N-1}$ and a shut-off transistor $825_N$. The shut-off transistor $825_N$ may be considered as a shut-off circuit connected to the sleep transistors $825_1$ to $825_{N-1}$ in parallel. The controller 830 may include a decoder logic circuit that generates the desired control signals according to the sleep and shut-off control signals.

Figure 8C:
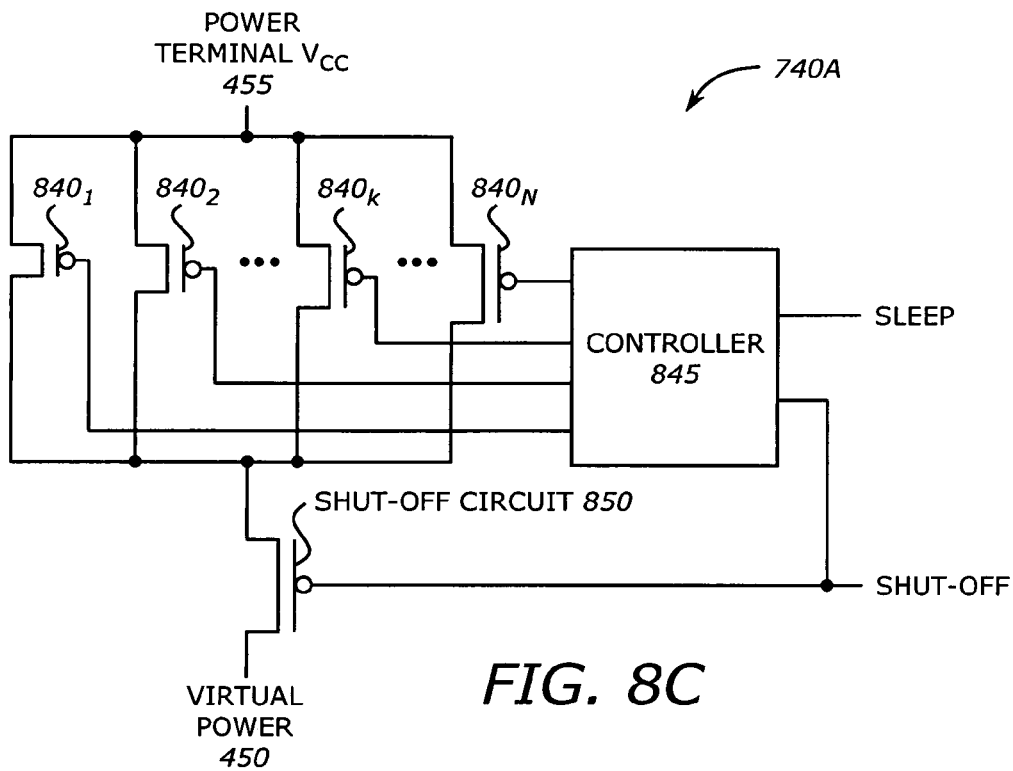
FIG. 8C is a diagram illustrating a sleep and shut-off circuit in series using p-devices according to one embodiment of the invention.

FIG. 8C is a diagram illustrating a sleep and shut-off circuit 740A in series using p-devices according to one embodiment of the invention. The sleep/shut-off circuit 740A includes sleep transistors $840_1$ to $840_N$, a controller 845, and a shut-off circuit 850. The sleep/shut-off circuit 740A is similar to the sleep/shut-off circuit 720A shown in FIG. 8A except that it is connected between the virtual power terminal 450 and the physical power terminal Vcc 455 and all the transistors are PMOS devices. The logic level of the control signals generated by the controller 845 is the reverse of that of the control signals generated by the controller 815.

Figure 8D:
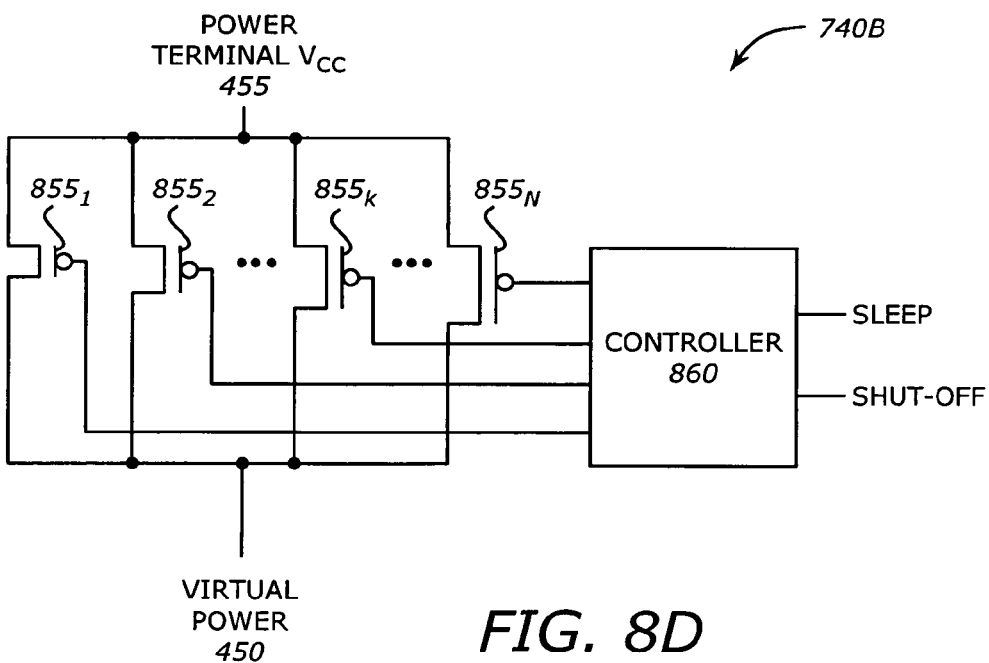
FIG. 8D is a diagram illustrating a sleep and shut-off circuit in parallel using p-devices according to one embodiment of the invention.

FIG. 8D is a diagram illustrating a sleep and shut-off circuit 740B in parallel using p-devices according to one embodiment of the invention. The sleep/shut-off circuit 740B includes sleep transistors $855_1$ to $855_N$ and a controller 860. The sleep/shut-off circuit 740B is similar to the sleep/shut-off circuit 720B shown in FIG. 8B except that it is connected between the virtual power terminal 440 and the physical power terminal Vcc 455 and all the transistors are PMOS devices. The logic level of the control signals generated by the controller 860 is the reverse of that of the control signals generated by the controller 830. In the shut-off mode, the controller 860 generates control signals to turn off all the sleep transistors $855_1$ to $855_N$, effectively shutting off all paths from virtual power terminal 450 to the physical power terminal 455.

Figure 8E:
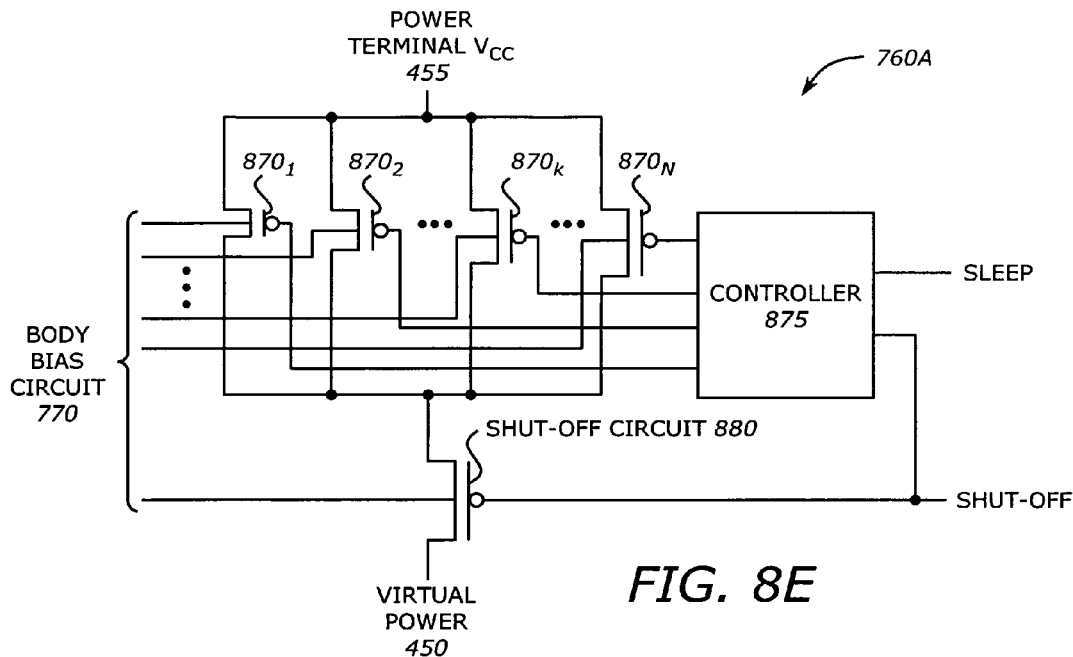
FIG. 8E is a diagram illustrating a sleep and shut-off circuit in series using p-devices with body bias according to one embodiment of the invention.

FIG. 8E is a diagram illustrating a sleep and shut-off circuit 760A in series using p-devices with body bias according to one embodiment of the invention. The sleep/shut-off circuit 760A includes sleep transistors $870_1$ to $870_N$, a controller 875, and a shut-off circuit 880. The sleep/shut-off circuit 740A is similar to the sleep/shut-off circuit 740A shown in FIG. 8C except that each of the PMOS transistors has a body bias applied to the well. The body bias voltage is provided by the body bias circuit 770 shown in FIG. 7C.

Figure 8F:
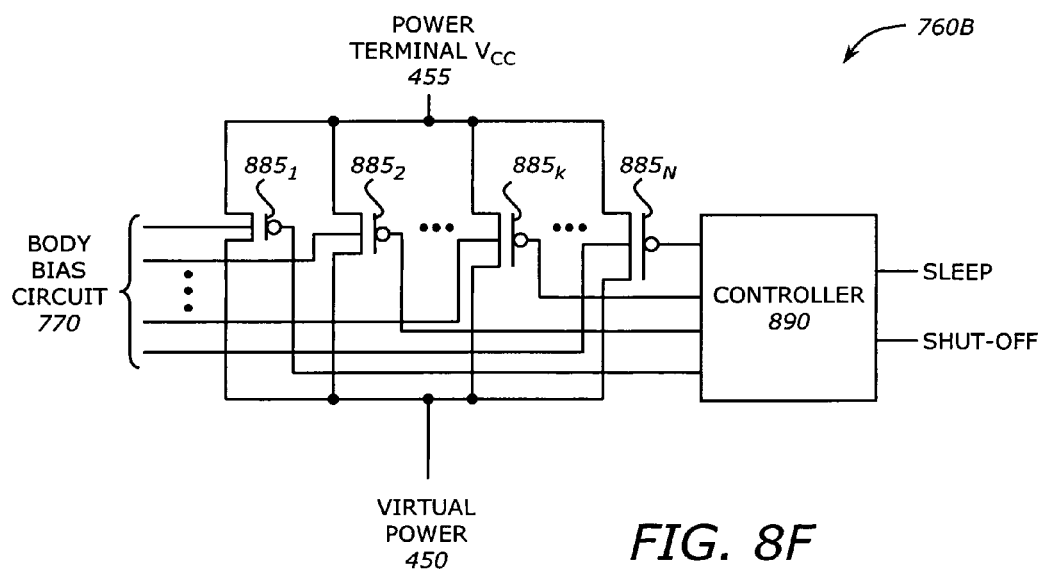
FIG. 8F is a diagram illustrating a sleep and shut-off circuit in parallel using p-devices with body bias according to one embodiment of the invention.

FIG. 8F is a diagram illustrating a sleep and shut-off circuit 760B in parallel using p-devices with body bias according to one embodiment of the invention. The sleep/shut-off circuit 760B includes sleep transistors $885_1$ to $885_N$ and a controller 890. The sleep/shut-off circuit 760B is similar to the sleep/shut-off circuit 740B shown in FIG. 8D except that each of the PMOS transistors has a body bias applied to the well. The body bias voltage is provided by the body bias circuit 770 shown in FIG. 7C. In the shut-off mode, the controller 860 generates control signals to turn off all the sleep transistors $855_1$ to $855_N$, effectively shutting off all paths from virtual power terminal 450 to the physical power terminal 455.

Figure 9:
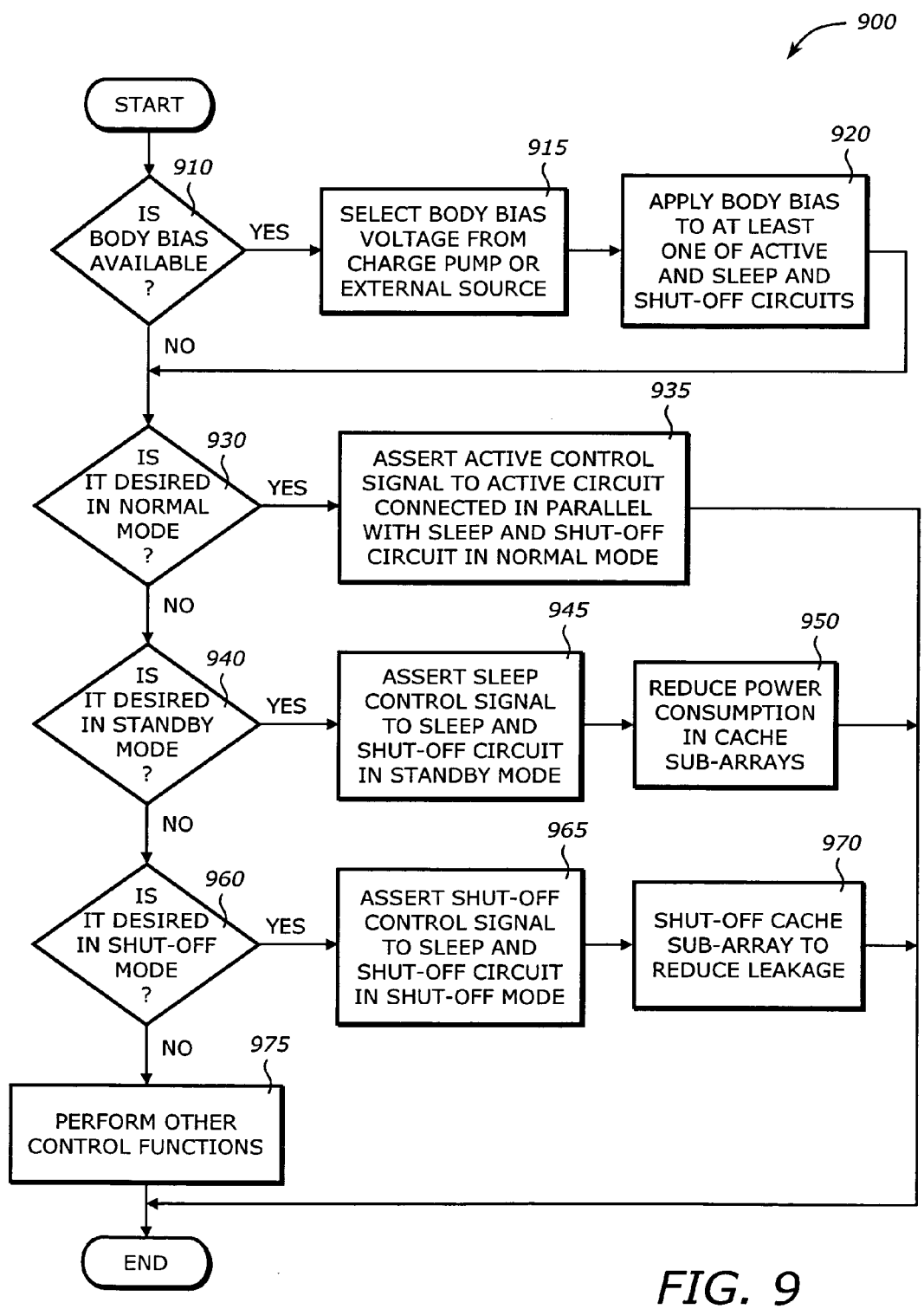
FIG. 9 is a flowchart to illustrate a process to control sub-arrays in a cache array according to one embodiment of the invention.

FIG. 9 is a flowchart to illustrate a process 900 to control sub-arrays in a cache array according to one embodiment of the invention.

Upon START, the process 900 determines if a body bias voltage is available (Block 910). If so, the process 900 selects the body bias voltage from a charge pump or an external source (Block 915) and applies the body bias voltage to at least one of the active circuit and the sleep/shut-off circuit (Block 920), and then proceeds to block 930. If a body bias voltage is not available, the process 900 determines if it is desired for the sub-array to be in the normal mode (Block 930). The normal mode is the mode in which the sub-array provides read/write accesses to the interfacing processor or device. If so, the process 900 asserts the active control signal to the active circuit (Block 935) and is then terminated. The active circuit is connected in parallel with the sleep/shut-off circuit. When in normal mode, the active circuit effectively short-circuits the sleep/shut-off circuit and connects the virtual supply (power or ground) to the corresponding supply terminal (power or ground) to enable the associated cache sub-array.

If it is not desired for the sub-array in the normal mode, the process 900 determines if it is desired for the sub-array to be in a standby mode (Block 940). The standby mode is the mode in which the sub-array is idle and consumes enough power to retain the data. If so, the process 900 asserts a sleep control signal to the sleep/shut-off circuit (Block 945). The process 900 then reduces power consumption in the associated cache sub-array by selectively turning on/off the transistors in the sleep circuit (Block 950) and is then terminated.

If it is not desired for the sub-array to be in the standby mode, the process 900 determines if it is desired for the sub-array to be in the shut-off mode (Block 960). If so, the process 900 asserts the shut-off control signal to the sleep/shut-off circuit (Block 965). Then, the process 900 shuts off the cache sub-array to reduce the leakage (Block 970) and is then terminated. If it is not desired for the sub-array to be in the shut-off mode, the process 900 performs other control functions as required (Block 975) and is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
a sleep and shut-off circuit coupled between a virtual supply terminal and a first physical supply terminal to reduce leakage from a cache sub-array when the cache sub-array is disabled in a shut-off mode, the shut-off mode being different than a sleep mode, the cache sub-array being coupled between the virtual supply terminal and a second physical supply terminal; and
an active circuit coupled to the sleep and shut-off circuit in parallel to enable the cache sub-array in a normal mode and to disable the cache sub-array in the shut-off mode;
wherein the sleep and shut-off circuit comprises:
a plurality of transistors of a transistor type coupled in parallel having different sizes to provide variable reduced power consumption according to the standby mode; and
a control circuit coupled to the plurality of transistors to selectively turn off the transistors providing the variable reduced power consumption.

2. The apparatus of claim 1 further comprising:
a reverse body bias circuit to provide a body bias voltage to reduce threshold voltage in the sleep and shut-off circuit and the active circuit.

3. The apparatus of claim 2 wherein the reverse body bias circuit comprises:
an analog multiplexer to provide a normal bias voltage in the normal mode and the body bias voltage in the shut-off mode.

4. The apparatus of claim 3 wherein the reverse body bias circuit further comprises:
a charge pump coupled to the analog multiplexer to provide the body bias voltage.

5. The apparatus of claim 3 wherein the body bias voltage is provided from an external pin.

6. The apparatus of claim 1 wherein the active circuit comprises:
an active transistor of the transistor type controlled by an active control signal, the active transistor being turned on in the normal mode and turned off in the shut-off mode.

7. The apparatus of claim 6 wherein the sleep and shut-off circuit further comprises:
a shut-off transistor of the transistor type controlled by a shut-off control signal, the shut-off transistor being turned off in the shut-off mode.

8. The apparatus of claim 7 wherein the transistor type is a p-type when the first physical supply terminal is a power terminal and the second physical terminal is a ground terminal.

9. The apparatus of claim 7 wherein the transistor type is an n-type when the first physical supply terminal is a ground terminal and the second physical terminal is a power terminal.

10. The apparatus of claim 1 wherein the different sizes are proportional according to a binary weighing scheme.

11. The apparatus of claim 1 wherein the control circuit comprises a decoder logic circuit to provide control signals to selectively turn off the transistors.

12. A method comprising:
negating an active control signal to an active circuit associated with a cache sub-array when the cache sub-array is disabled; and
asserting a shut-off control signal in a shut-off mode to a sleep and shut-off circuit to reduce leakage from the cache sub-array, the sleep and shut-off circuit being connected in parallel with the active circuit between a virtual supply terminal and a first physical supply terminal, the shut-off mode being different than a sleep mode, the cache sub-array being connected to the virtual supply terminal and a second physical supply terminal;
wherein asserting the shut-off control signal comprises:
turning off a shut-off transistor; and
selectively turning off a plurality of sleep transistors to provide variable reduction of power consumption.

13. The method of claim 12 further comprising:
providing a body bias voltage in the shut-off mode to reduce threshold voltage in the sleep and shut-off circuit and the active circuit using a reverse body bias circuit.

14. The method of claim 13 wherein providing the body bias voltage comprises:
providing the body bias voltage using a charge pump or an external voltage source from an external pin.

15. The method of claim 13 wherein providing the body bias voltage comprises:
providing a normal bias voltage in a normal mode and the body bias voltage in the shut-off mode.

16. The method of claim 12 wherein the shut-off transistor is a p-type transistor when the first physical supply terminal is a power terminal and the second physical terminal is a ground terminal.

17. The method of claim 12 wherein the shut-off transistor is an n-type transistor when the first physical supply terminal is a ground terminal and the second physical terminal is a power terminal.

18. The method of claim 12 wherein the plurality of the sleep transistors has different sizes proportional according to a binary weighing scheme.

19. The method of claim 12 wherein selectively turning off the plurality of sleep transistors comprises generating control signals by a decoder logic circuit.

20. A system comprising:
a processor core; and
a cache array coupled to the processor core, the cache array including at least a cache sub-array and a leakage control circuit, the leakage control circuit comprising:
a sleep and shut-off circuit coupled between a virtual supply terminal and a first physical supply terminal to reduce leakage from the cache sub-array when the cache sub-array is disabled in a shut-off mode, the shut-off mode being different than a sleep mode, the cache sub-array being coupled to the virtual supply terminal and a second physical supply terminal, and
an active circuit coupled to the sleep and shut-off circuit in parallel to enable the cache sub-array in a normal mode and to disable the cache sub-array in the shut-off mode;
wherein the sleep and shut-off circuit comprises:
a sleep circuit to reduce power consumption to the cache sub-array when the cache sub-array is in a standby mode or the sleep mode, the sleep circuit comprising:
a plurality of transistors of a transistor type coupled in parallel having different sizes to provide variable reduced power consumption according to the standby mode, and
a control circuit coupled to the plurality of transistors to selectively turn off the transistors providing the variable reduced power consumption; and
a shut-off circuit coupled to the sleep circuit to shut off the cache sub-array in the shut-off mode when the cache sub-array is disabled, the shut-off circuit comprising a shut-off transistor of the transistor type controlled by a shut-off control signal, the shut-off transistor being turned off in the shut-off mode.

21. The system of claim 20 wherein the leakage control circuit further comprising:
a reverse body bias circuit to provide a body bias voltage to reduce threshold voltage in the sleep and shut-off circuit and the active circuit, the body bias voltage being provided by a charge pump or an external voltage source from an external pin.

22. The system of claim 20 wherein the plurality of the sleep transistors has different sizes proportional according to a binary weighing scheme.

23. The system of claim 20 wherein the control circuit comprises a decoder logic circuit to provide control signals to selectively turn off the transistors.

* * * * *